United States Patent [19]

Moeller et al.

[11] Patent Number: 4,511,756
[45] Date of Patent: Apr. 16, 1985

[54] AMORPHOUS SILICON SOLAR CELLS AND A METHOD OF PRODUCING THE SAME

[75] Inventors: Matthias Moeller; Helmold Kausche, both of Munich, Fed. Rep. of Germany

[73] Assignee: Siemens Aktiengesellschaft, Berlin & Munich, Fed. Rep. of Germany

[21] Appl. No.: 523,609

[22] Filed: Aug. 16, 1983

[30] Foreign Application Priority Data

Nov. 19, 1982 [DE] Fed. Rep. of Germany ....... 3242831

[51] Int. Cl.$^3$ .................. H01L 31/06; H01L 31/18
[52] U.S. Cl. .................................. 136/258; 136/256; 29/572; 427/39; 427/74; 204/192 C; 204/192 SP; 357/30
[58] Field of Search ................ 136/255, 256, 258 PC, 136/258 AM, 259; 357/2, 30; 29/572; 427/39, 74, 86; 204/192 C, 192 SP

[56] References Cited

FOREIGN PATENT DOCUMENTS 3023165 1/1982 Fed. Rep. of Germany ...... 136/259
55-108780 8/1980 Japan ................................. 136/259

OTHER PUBLICATIONS

Y. Uchida et al., "Conversion Efficiency of Large Area a-Si:H Solar Cell", *Conference Proceedings, 15th IEEE Photovoltaic Specialists Conference,* Florida, (1981), pp. 922–927.

Marc Wittmer, "TiN and TaN as Diffusion Barriers in Metallizations to Silicon Semiconductor Devices", *Appl. Phys. Lett.,* vol. 36, No. 6, (1980), pp. 456–458.

*Primary Examiner*—Aaron Weisstuch
*Attorney, Agent, or Firm*—Hill, Van Santen, Steadman & Simpson

[57] ABSTRACT

Solar cells having a semiconductor body composed of amorphous silicon which is deposited on a substrate coated with aluminum at least on one of its surfaces, with a diffusion barrier layer composed of titanium nitride positioned between the aluminum layer and the semiconductor body. The aluminum layer and the titanium nitride layer can be produced by high frequency sputtering while the semiconductor body can be produced by a glow discharge deposition.

6 Claims, 1 Drawing Figure

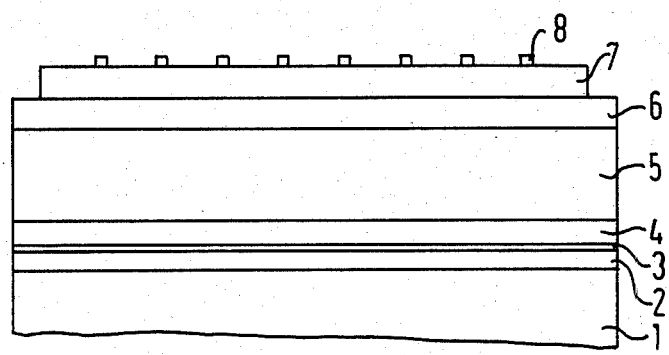

AMORPHOUS SILICON SOLAR CELLS AND A METHOD OF PRODUCING THE SAME

BACKGROUND OF THE INVENTION

1. Field of the Invention

The invention relates to solar cells and somewhat more particularly to solar cells having a semiconductor body formed of amorphous silicon and which is applied to a substrate having a metal layer at least on one surface thereof and functioning as a back contact as well as a method of producing such solar cells.

2. Prior Art

The formation of solar cells comprised of amorphous silicon (sometimes referred to as a-Si) on insulating, but not necessarily transparent, substrates, such as glass, ceramic, or Kapton (a trade name for a commercially available polyimide film), is particularly significant because series-interconnected solar cells can be readily fabricated on such a substrate by a simple mask technique. In order to achieve this, a metal layer with a relatively low surface resistance (approximately 50 m Ohm with a 50 $cm^2$ cell size) must first be applied to the substrate as a back contact.

It is known from the *Conference Proceedings of the Fifteenth IEEE Photovoltaic Specialist Conference*, Florida (1981) pages 922–927, especially FIG. 1, to utilize special steel discs as the substrate in producing a-Si solar cells.

However, aluminum would be particularly well suited as a back contact material because of its high conductivity and economical price. Decisive, with production by means of high frequency sputtering, is that the crystalline size of an aluminum layer so-produced is less than about 500 nm—which can be perceived a the reflective surface and is achieved by means of alloying with silicon—as well as that the resultant layer is thermally stable because of the subsequent a-Si:H deposition, which occurs at about 250° C. Aluminum layers produced in this manner satisfy these requirements.

Aluminum could not heretofore be utilized as a substrate material for amorphous silicon cells because aluminum diffuses to a large degree into amorphous silicon already at temperatures of about 150° C. and, thus, greatly deteriorates cell efficiency.

SUMMARY OF THE INVENTION

The invention provides an amorphous silicon solar cell having as a back metal layer, an aluminum layer and thus forming the substrate material for such solar cells.

In accordance with the principles of the invention, a solar cell of the type earlier described is produced on an aluminum substrate provided with a diffusion barrier layer consisting of titanium nitride, which is in contact with amorphous silicon.

In addition to preventing aluminum diffusion into an amorphous silicon body, the utilization of a titanium nitride layer is also exploited in regard to the relatively intense hardness exhibited by such layer to render the subsequently applied amorphous silicon cell substantially insensitive to mechanical loads as arise, for example, during application of masks in the fabrication of upper surface electrodes.

The advantages of a titanium nitride layer, in comparison to a pure titanium layer, include a greater barrier effect exhibited by titanium nitride as well as the fact that the crystalline size of titanium nitride is relatively small, i.e., a titanium nitride layer is mirror smooth.

The surface resistance of a titanium nitride layer having a thickness in the range of about 0.1 through 0.5 nm and preferably a thickness of about 0.2 nm, is about 200 Ohm. This value is about 10 times higher than the resistance of a pure titanium layer, presumably being related to the nitrogen incorporation. Nevertheless, the resistance of a titanium nitride layer is low enough so as not to have a measurable effect as a series resistance in the cell function, as was documented by producing small (6 $mm^2$) cells on pure titanium nitride layers in comparison to similar sized cells produced on (low resistant) chrome-nickel layers.

In further accord with the principles of the invention, a titanium nitride layer is produced by high frequency sputtering, with the use of a target consisting of titanium in an enclosed gas atmosphere containing nitrogen so that a titanium nitride layer of a select thickness is generated on a suitable substrate body, such as an aluminum layer positioned on a glass body. Subsequently, an amorphous silicon semiconductor body is deposited onto the titanium nitride layer by thermal decomposition of a gaseous compound containing silicon therein—to which select dopant compounds can be added under given conditions—under the influence of a glow discharge plasma. In an exemplary sputtering set-up, an argon gas pressure of $3 \times 10^{-2}$ Torr and a nitrogen gas pressure of $0.2 \times 10^{-2}$ Torr, with a power of 3 W/$cm^2$ were utilized. Further detail of such a set-up can be derived from an article by M. Wittmer in *Appl. Phys. Lett.*, Vol. 36, No. 6, Mar. 15, 1980, pages 456–458.

BRIEF DESCRIPTION OF THE DRAWINGS

The FIGURE shows a sectional, somewhat schematic view of a solar cell (pin/ITO cell) produced in accordance with the principles of the invention.

DESCRIPTION OF PREFERRED EMBODIMENTS

As shown in the drawing, a substrate body 1, for example composed of glass, is provided with an aluminum layer 2 having a thickness in the range of about 200 through 2000 nm. Next, a titanium nitride layer 3, having a thickness of about 200 nm is applied onto the aluminum layer 2. Thereafter, an amorphous silicon semiconductor body 4, 5, 6 is applied to the titanium nitride layer 3. The amorphous silicon semiconductor body, in an exemplary embodiment, comprises a p-doped amorphous silicon layer 4 having a thickness of about 20 nm, an intrinsic amorphous silicon layer 5 having a thickness of about 500 nm and an n-doped amorphous silicon layer 6 having a thickness of about 10 nm. Thereafter an indium-tin-oxide layer 7 (ITO) of a thickness of 70 nm which serves both as an antireflection and a conductive (200ΩΩ) layer is deposited by electron beam evaporation from ITO pellets in an $O_2$-atmosphere of $\sim 10^4$ mbar. The ITO layers have to be annealed at 250° C. to become transparent. Finally, a finger electrode structure 8 is generated by evaporation of a Nichrome and subsequently a Ni-layer through a mask which is thereafter dipped into a SnPb melt for soldering to yield high conductive electrodes.

In generating the above solar cell, an operational sputtering device is utilized and which typically has a controllable gas inlet connectable to select pressurized gas sources, such as a pressurized argon gas container, a pressurized nitrogen gas container, a pressurized dopant compound container, a pressurized silicon-containing gaseous compound, etc. In addition, the sputtering device is controllably connected to a suitable high frequency energy source. In operation, for example, an aluminum target into which silicon is alloyed by 1% is positioned within the sputtering device, along with an appropriately spaced substrate heated to 200° C. and argon is fed into the sputtering space at a pressure of $10^{-2}$ mb (millibar), while high frequency energy is directed at the 8" target so that relatively small size aluminum crystals (on the order of about 50 nm) are deposited on a substrate with a rate of about 25 nm/min, until a desired layer of thickness, generally about 200 through 2000 nm is attained. The aluminum target is then removed or appropriately masked while a titanium target is inserted or uncovered. The gas atmosphere within the sputtering space is adjusted so that an argon gas pressure of about $4 \times 10^{-2}$ mb (millibar) and a nitrogen gas pressure of about $3 \times 10^{-3}$ mb are present, while the high frequency power is adjusted to about 3 W/cm$^2$ so that a relatively thin titanium nitride layer is generated on the aluminum layer positioned on the substrate body. Subsequently, the targets are removed or masked and a thermally-decomposable silicon-yielding gaseous compound such as monosilane or disilane, along with about 1% of gaseous dopant-yielding compounds like diborane or phosphine to produce the n- or m-type layer, are fed into the reaction space. The gas pressure is chosen to be about 0.2 mb and the rf-power adjusted to about 10 mW/cm$^2$ so that a glow discharge plasma occurs and the gaseous compounds thermally decompose under the influence of the glow discharge plasma so as to deposit amorphous silicon on the titanium nitride layer. As indicated above, the amorphous silicon layer so-deposited can be either p-doped, n-doped or intrinsic.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

What we claim as our invention:

1. In a solar cell having a semiconductor body composed essentially of amorphous silicon applied to a substrate having at least one surface thereof comprised of a metal layer functioning as a back contact, the improvement which comprises employing as said metal layer one which is composed of aluminum and which further comprises a diffusion barrier layer composed of titanium nitride positioned between said metal layer and said semiconductor body.

2. A solar cell as defined in claim 1, wherein said aluminum layer has a thickness in the range of about 200 to 2000 nm.

3. A solar cell as defined in claim 1, wherein said titanium nitride layer has a thickness in the range of about 0.1 to 0.5 nm and exhibits a surface resistance of about 200 Ohms.

4. A solar cell as defined in claim 3, wherein said titanium nitride layer has a thickness of about 0.2 nm.

5. A method of producing a solar cell having a semiconductor body composed essentially of amorphous silicon applied to a substrate having at least at one surface thereof comprised of an aluminum layer functioning as a back contact and further having a diffusion barrier layer composed of titanium nitride positioned between said aluminum layer and said semiconductor body, said method comprising the steps of:
   applying said aluminum layer onto a substrate by high frequency sputtering;
   generating a titanium nitride layer onto said aluminum layer by high frequency sputtering with the use of a target composed of titanium in a gas atmosphere containing nitrogen; and
   depositing an amorphous semiconductor body onto the titanium nitride layer by thermally decomposing a gaseous compound containing silicon to which selected dopant compounds are added under given conditions under the influence of a glow discharge plasma.

6. A method as defined in claim 5 wherein, during generation of said titanium nitride layer, an argon gas pressure of about $4 \times 10^{-2}$ mb and a nitrogen gas pressure of about $3 \times 10^{-3}$ mb are utilized with a high frequency power of about 3 W/cm$^2$.

* * * * *